(12) United States Patent
Kinzer et al.

(10) Patent No.: US 6,787,872 B2
(45) Date of Patent: Sep. 7, 2004

(54) LATERAL CONDUCTION SUPERJUNCTION SEMICONDUCTOR DEVICE

(75) Inventors: Daniel M. Kinzer, El Segundo, CA (US); Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/891,727

(22) Filed: Jun. 26, 2001

(65) Prior Publication Data

US 2002/0195627 A1 Dec. 26, 2002

(51) Int. Cl.$^7$ .............................................. H01L 23/58
(52) U.S. Cl. ...................................... 257/492; 257/493
(58) Field of Search ................................ 257/492, 493, 257/288, 332, 487, 510

(56) References Cited

U.S. PATENT DOCUMENTS

| | | | | |
|---|---|---|---|---|
| 4,605,948 A | * | 8/1986 | Martinelli ..................... 357/34 |
| 4,754,310 A | * | 6/1988 | Coe .............................. 357/13 |
| 5,233,215 A | * | 8/1993 | Baliga ......................... 257/490 |
| 5,323,040 A | * | 6/1994 | Baliga ......................... 257/332 |
| 5,436,173 A | * | 7/1995 | Houston ...................... 437/21 |
| 5,449,946 A | * | 9/1995 | Sakakibara et al. ......... 257/487 |
| 5,539,238 A | * | 7/1996 | Malhi .......................... 257/510 |
| 5,592,005 A | * | 1/1997 | Floyd et al. ................. 257/331 |
| 5,679,966 A | * | 10/1997 | Baliga et al. ................ 257/139 |
| 5,710,455 A | * | 1/1998 | Bhatnagar et al. .......... 257/472 |
| 5,801,431 A | * | 9/1998 | Ranjan ........................ 257/659 |
| 5,844,275 A | * | 12/1998 | Kitamura et al. ........... 257/335 |
| 5,861,657 A | * | 1/1999 | Ranjan ........................ 257/492 |
| 5,874,767 A | * | 2/1999 | Terashima et al. .......... 257/487 |
| 5,885,878 A | * | 3/1999 | Fujishima et al. .......... 438/302 |
| 6,040,600 A | * | 3/2000 | Uenishi et al. .............. 257/330 |
| 6,069,396 A | * | 5/2000 | Funaki ........................ 257/492 |
| 6,307,246 B1 | * | 10/2001 | Nitta et al. .................. 257/493 |
| 2002/0130358 A1 | * | 9/2002 | Van Dalen et al. ......... 257/328 |
| 2002/0177277 A1 | * | 11/2002 | Baliga ......................... 328/268 |

\* cited by examiner

Primary Examiner—Mary Wilczewski
Assistant Examiner—Monica Lewis
(74) Attorney, Agent, or Firm—Ostrolenk, Faber, Gerb & Soffen, LLP

(57) ABSTRACT

A lateral conduction superjunction semiconductor device has a plurality of spaced vertical trenches in a junction receiving layer of P$^-$ silicon. An N$^-$ diffusion lines the walls of the trench and the concentration and thickness of the N$^-$ diffusion and P$^-$ mesas are arranged to deplete fully in reverse blocking operation. A MOSgate structure is connected at one end of the trenches and a drain is connected at its other end. An N$^-$ further layer or an insulation oxide layer may be interposed between a P$^-$ substrate and the P$^-$ junction receiving layer.

28 Claims, 6 Drawing Sheets

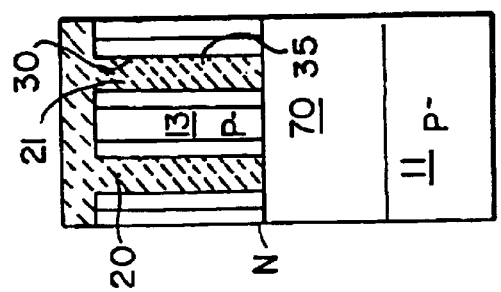
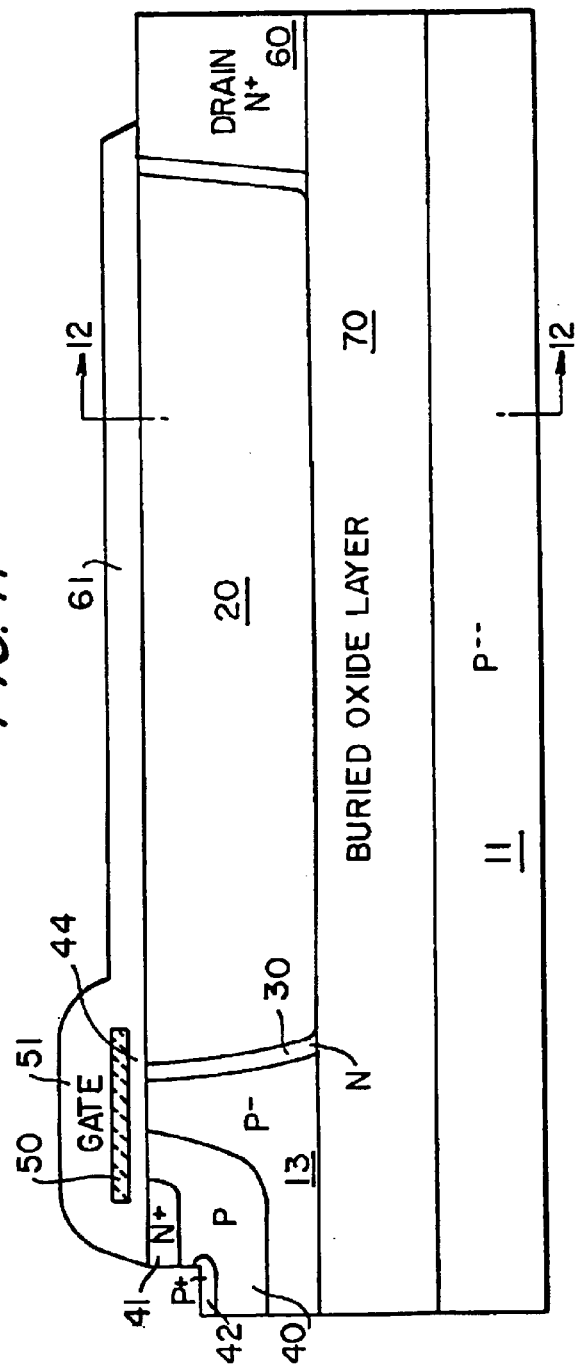

US 6,787,872 B2

LATERAL CONDUCTION SUPERJUNCTION SEMICONDUCTOR DEVICE

FIELD OF THE INVENTION

This invention relates to semiconductor devices and more specifically relates to a novel lateral conduction superjunction MOSFET device.

BACKGROUND OF THE INVENTION

MOSFET superjunction devices are well known and are disclosed in U.S. Pat. Nos. 4,754,310 and 5,216,275 and in a publication entitled "Simulated Superior Performance of Semiconductor Superjunction Devices" by Fujihara and Miyaska in the Proceedings of 1998 International Symposium on Semiconductor Devices & ICs, pages 423 to 426. Such superjunction devices have required deep trenches or sequentially deposited and diffused P and N epitaxially layers of silicon. Further, the operational characteristics of prior superjunction devices have not been optimized.

BRIEF DESCRIPTION OF THE INVENTION

In accordance with a first feature of the invention, a lightly conductive P⁻ substrate is provided, and an N⁻ epitaxial layer and then a P⁻ epitaxial layer are grown on the P⁻ substrate. Laterally elongated and spaced trenches are formed from the top of the P⁻ epitaxial region and extend down and slightly into the N⁻ substrate. The trenches define P⁻ mesas between them. An N⁻ diffusion liner is then diffused into the walls and bottom of the trenches. The trenches are then filled with silicon dioxide insulation. The N⁻ diffusion liner has a resurf concentration of 1E12 ions per cm² over the full exposed N-trench area. The P⁻ pillars have a concentration of 2E12 ions/cm².

In other embodiments of the invention, the P⁻ epi layer can be formed on an SOI (Silicon on Insulator) substrate.

The novel structure of the invention provides a number of advantages over prior art devices:
1. A shallower trench is needed to fabricate the device. Thus, a 15 micron deep trench can be used in place of a prior art 35 micron trench for a 600 volt device.
2. A denser structure can be made, using a 1 micron pitch. Since pitch is proportional to on-resistance $R_{DSON}$ the reduction of pitch is very desirable.
3. Since the device is a lateral conduction device, it will have a reduced gate charge $Q_g$ which is essential to many applications.
4. The novel structure of the invention lends itself to the integration of plural devices in a common chip, for example, a bridge circuit can be integrated into a single chip.
5. The device can act as a high side switch when the N⁻ layer is designed to support the rail voltage between source and substrate. High side devices, low side devices and control circuitry can then be integrated into the same silicon.

BRIEF DESCRIPTION OF THE DRAWINGS

FIG. 11 shows a second embodiment of the invention in which an oxide insulation layer is used in place of the N type epi layer of FIGS. 7 and 8.

FIG. 12 shows a cross-section of FIG. 11 taken across section line 12—12 in FIG. 11.

DETAILED DESCRIPTION OF THE DRAWINGS

Figure 1:
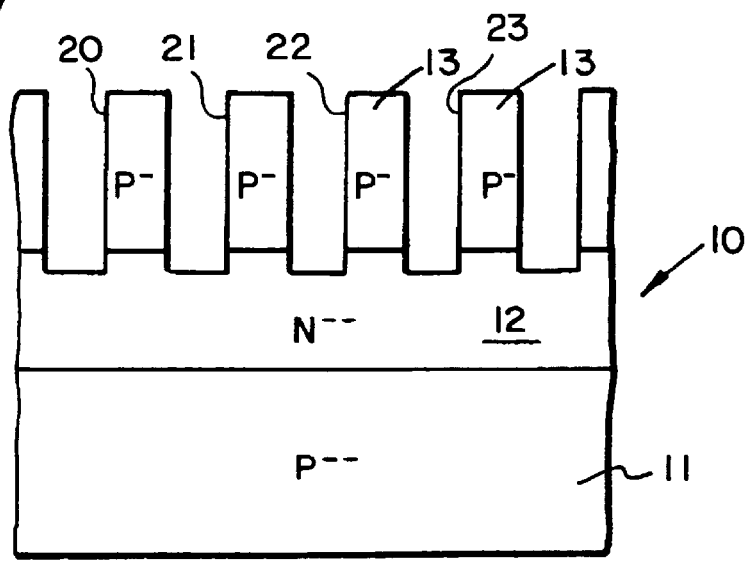
FIG. 1 is a cross-section through a small section of the active area of a wafer after the etching of trenches therein in a process to make a device in accordance with the invention.

Referring first to FIG. 1, there is shown a small portion of the active area of a wafer 10 of silicon which is to be processed in accordance with the invention. Wafer 10 may have a very lightly doped P⁻ main body 11 of float zone material. A very lightly doped epitaxial layer of N⁻ silicon 12 is grown atop layer 11. P⁻ region 13 is next epitaxially grown atop the N⁻ region 12.

In one embodiment of the invention, and for a 600 volt device, the P⁻ region 11 may have a concentration of about 2E14 of any desired P type impurity. The N⁻ region 12 may have a concentration corresponding to a dose of 1E12 of a suitable impurity species, thus forming a RESURF dose. The P⁻ region 13 has a concentration corresponding to a double RESURF dose of 2E12 of a suitable P type impurity.

As further shown in FIG. 1, a plurality of parallel laterally elongated trenches 20 to 23 are formed through the P⁻ region 13 and into the top of N⁻ region 12. The trenches may be of any length, depending on the desired breakdown voltage of the device, and, for a 600 volt device, may be about 40 microns long. The mesa width, that is, the space between trenches, may be about 1.0 microns and the trenches may be about 5 microns deep and about 0.5 microns wide. The trenches preferably extend into N⁻ region 12 for about 0.15 microns. To obtain the desired RESURF dose for the above sized mesa, a P⁻ concentration of 2E16 ions/cm³ should be used.

Figure 2:
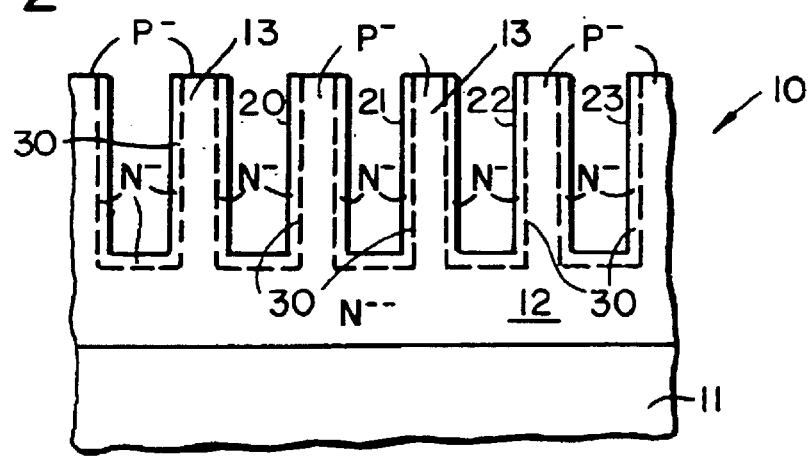
FIG. 2 is a cross-section of the area of FIG. 1 after the formation of an N⁻ implant in the trench walls and bottom.

After forming trenches 20 to 23, and as shown in FIG. 2, the walls of the trenches receive an N⁻ diffusion 30 which produces a RESURF diffusion of equivalent dose of 1E12/cm² along the bottoms of the trenches. In order for the structure to work properly, the depth of P⁻ diffusion 30 and the depth of the trench should be close to one another, and, below the trench, the P concentration should drop to the amount required to support 600 volts (the BV voltage) in the bulk, which is about 2E14 ions per cm³. One way to achieve this is to control the concentration of the P deposit in the mesas is by diffusion from the sidewalls. The doping could also be achieved by diffusion from a doped film or by bombardment with a doped plasma.

Figure 3:
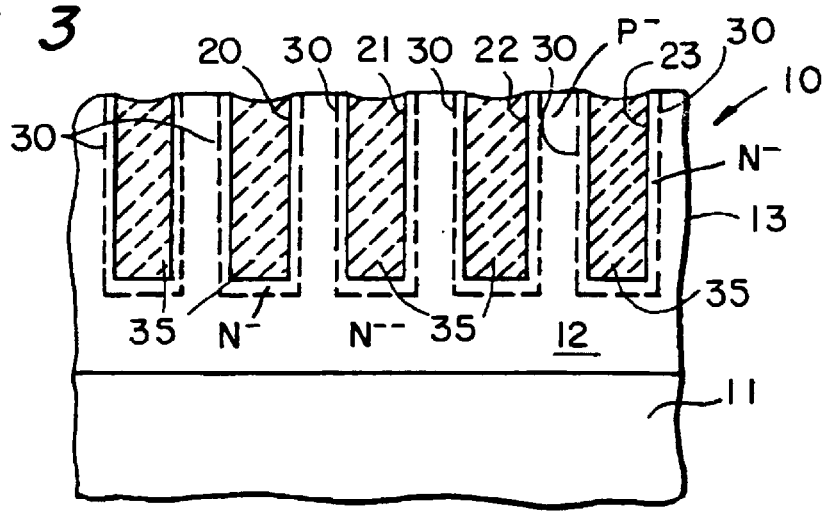
FIG. 3 is a cross-section of FIG. 2 after the grooves are filled with oxide.

As next shown in FIG. 3, a suitable dielectric, for example, silicon dioxide 35, fills in the trenches by thermal growth or by deposition.

Figure 4:
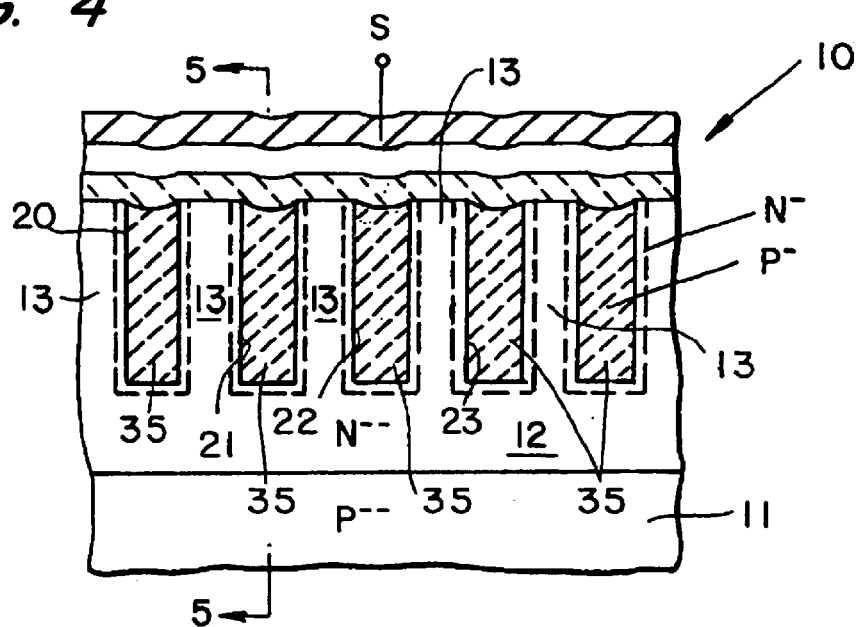
FIG. 4 is a cross-section like that of FIG. 3 after the deposition of oxide over the full upper surface of the active area and is a cross-section of FIG. 5 taken across section line 4—4 in FIG. 5.
Figure 5:
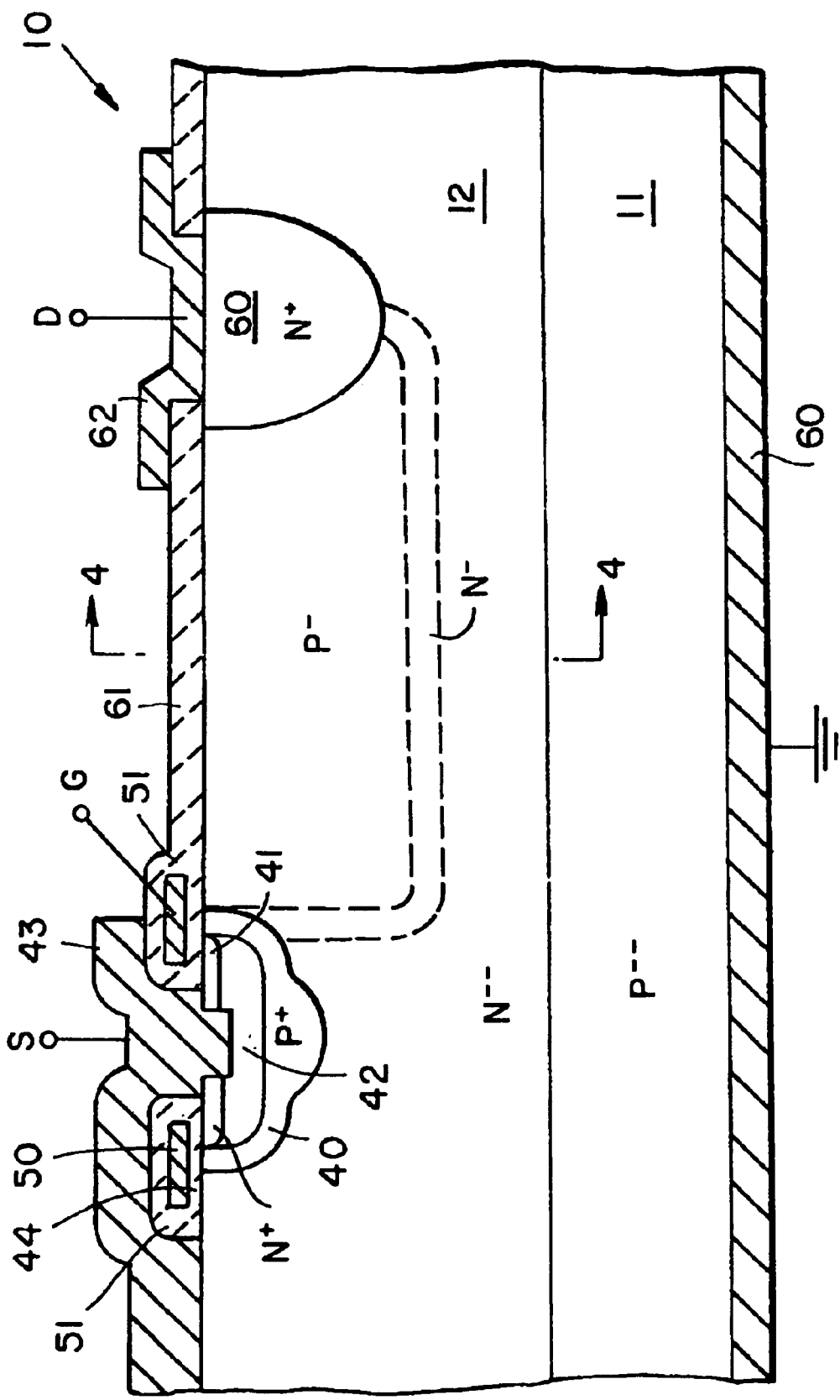
FIG. 5 is a cross-section of FIG. 4 taken across section line 5—5 in FIG. 4.

As next shown in FIGS. 4 and 5, a MOSgate structure is formed (in any desired sequence) and the source and drain electrodes are also formed. More specifically, the MOSgate structure may include a conventional P⁻ 40 which contains an N⁻ source 41. A P⁺ diffusion 42 may also underlie the source region. The center of the source/base structure receives a shallow etch which is later filled by source electrode 43. A conventional gate oxide 44 covers the lateral invertible channel between the source 41 and the lightly doped portion of base 40 regions and a conductive polysilicon gate electrode 50 overlies the gate oxide. An insulation layer 51 of low temperature oxide, for example, insulates gate electrode 50 from the source metal 43.

As next shown in FIG. 5, an N⁺ drain 60 extends from the top of P⁻ region 13 to N⁻ diffusion 30 and the N⁻ region 12. The top of regions or mesas 13 receives a field oxide 61 (FIGS. 4 and 5) which has an opening therethrough to receive drain contact 62 which contacts N⁺ drain 60.

Figure 6:
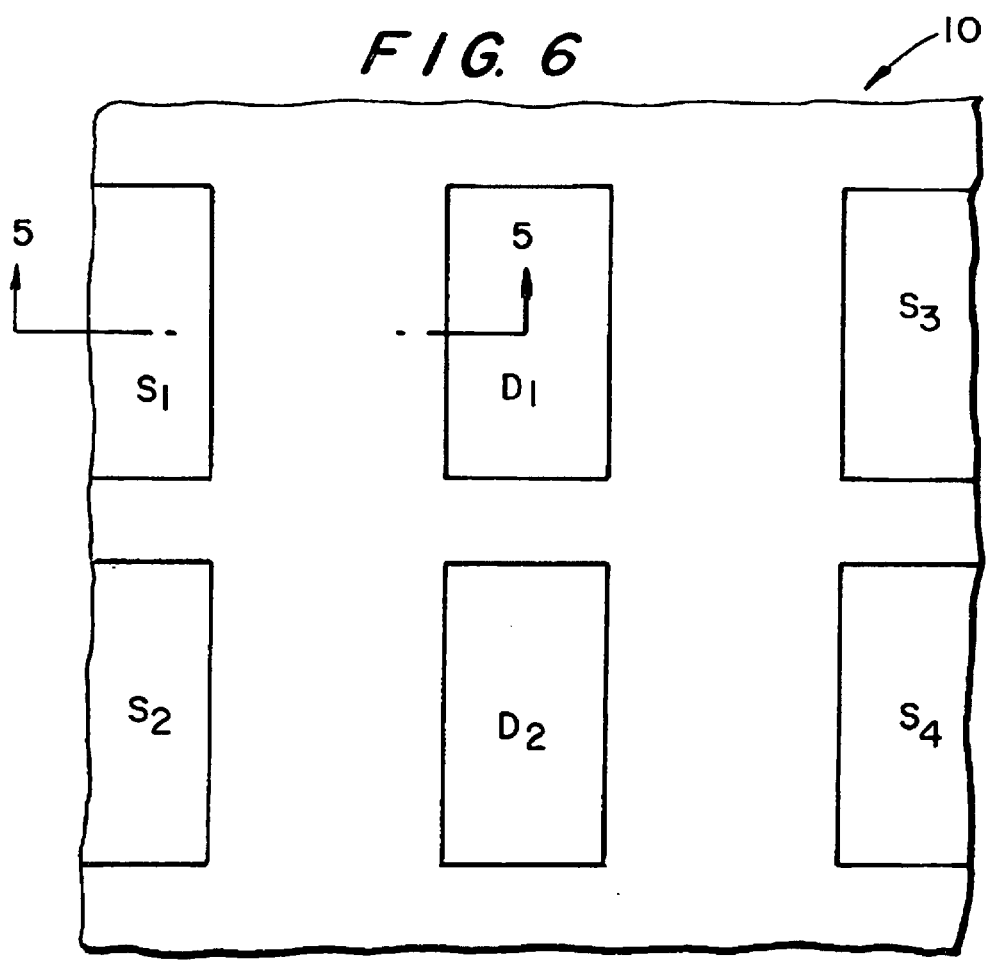
FIG. 6 is a top view of the wafer of FIGS. 4 and 5, showing the main electrode for a plurality of devices integrated into a common chip.

FIG. 6 shows a topology which can be used for the structure of FIGS. 4 and 5, where a plurality of separate but repeating elements are formed which each laterally adjacent source and drain regions $S_1$ to $S_4$ and $D_1$, $D_2$ have the same structures as shown in FIGS. 4 and 5. The source regions $S_1$ to $S_4$ may be for separate integrated devices, or alternatively, may be connected together and, similarly, drains $D_1$ and $D_2$ may be separate or connected together. Gate electrodes $G_1$ to $G_4$ may also be located adjacent sources $S_1$ to $S_4$ respectively and are connected to their respective gate electrodes such as gate electrode 50.

The operation of the device of FIGS. 4 and 5 is as follows:

In the blocking mode, and when source 43 and gate 50 are grounded with respect to substrate 12, and a high relative bias is applied to drain 62, the voltage in the lateral direction is supported entirely in the trench structure, and P⁻ regions 13 and N⁻ diffusions 30 fully deplete, allowing an almost uniform electric field distribution along the trench length. This depletion region extends downwardly into N⁻ region 12.

In the conduction mode of operation, and with the application of a bias to gate electrode 50 and the grounding of source 43 relative to substrate 12, an N type channel is formed between source regions 41 and base 40. The application of a bias to drain 60 will cause a current to flow in the device through the undepleted P⁻ and N⁻ regions 13 and 30.

Figure 8:
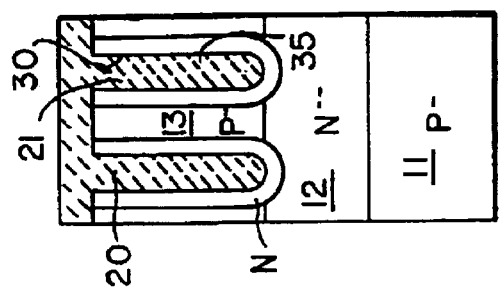
FIG. 7 and FIG. 8 are similar to FIGS. 4 and 5 respectively.
Figure 7:
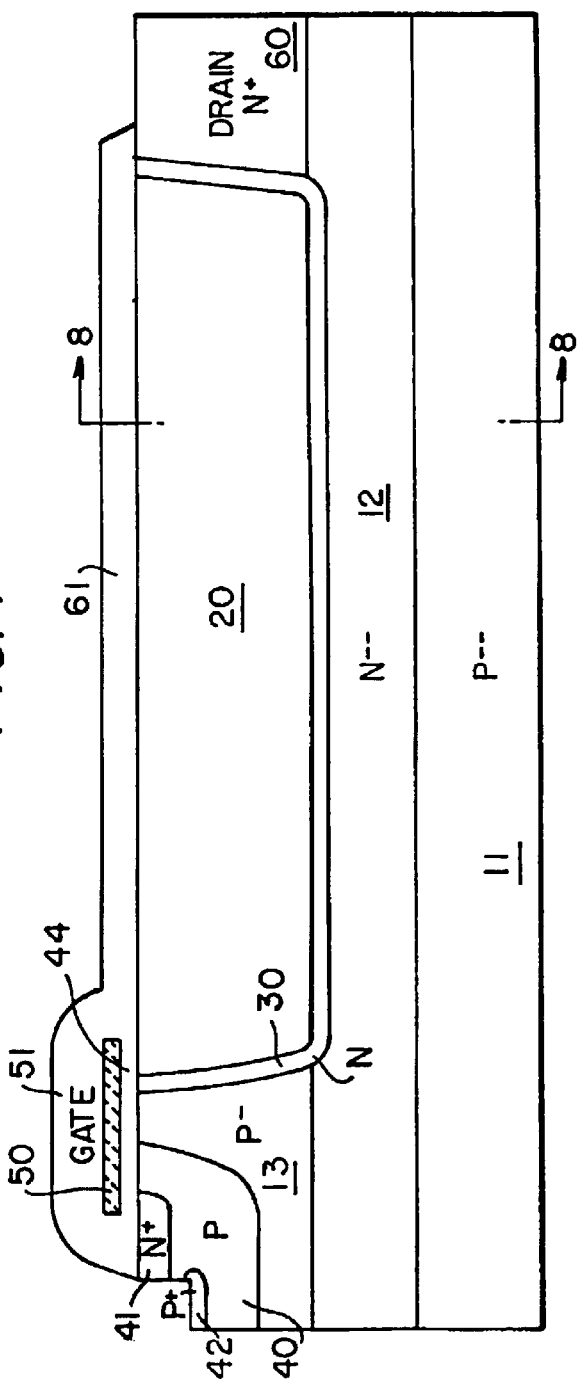

Referring next to FIGS. 7 to 11, the novel structure of FIGS. 4 and 5 is duplicated in FIGS. 7 and 8 so that it can be easily contrasted to the two additional embodiments of FIGS. 9, 10 and FIGS. 11 and 12 respectively. The same numerals are used throughout to identify similar components.

Figure 10:
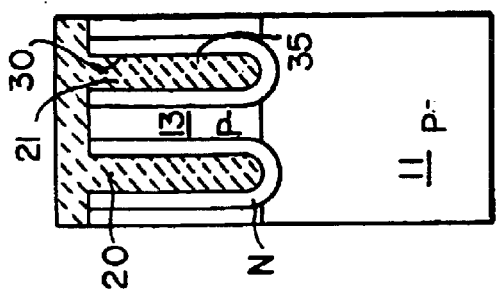
FIG. 10 shows a cross-section of FIG. 9 taken across section line 10—10 in FIG. 9.
Figure 9:
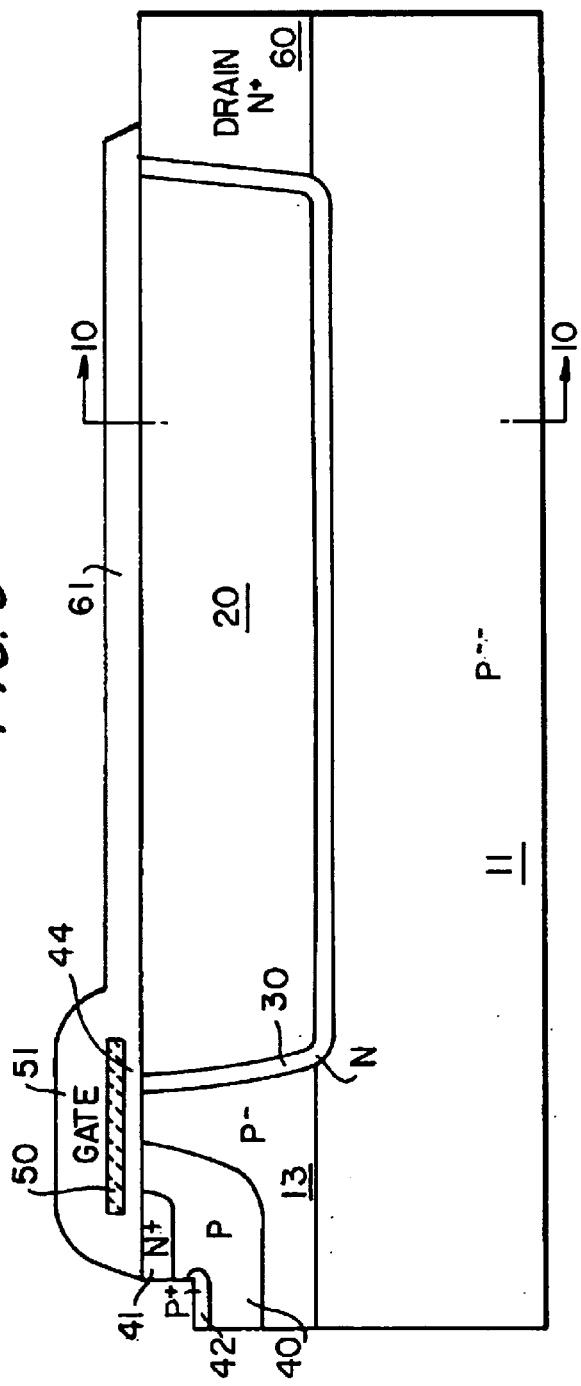
FIG. 9 shows a second embodiment of the invention which eliminates the intermediate N type epi layer of FIGS. 7 and 8.

Referring to FIGS. 9 and 10, there is shown a simplified arrangement compared to that of FIGS. 4, 5, 7 and 8 which eliminates the N⁻ region 12 of FIGS. 7 and 8. Thus, the source 41 and substrate 11 are shorted so the device cannot withstand voltage (preventing its use as a high-side switch). However, the device of FIGS. 9 and 10 withstands voltage between the drain 60 and the source electrode by the resurf principle.

Referring next to FIGS. 11 and 12, an oxide insulation layer 70 is used in place of N⁻ region 12 and the active area is formed on the surface of layer 70. Thus, the device, unlike that of FIGS. 7 and 8, can be used as a high-side switch.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A lateral conductive superjunction semiconductor device comprising: a trench receiving layer of one of the conductivity types supported atop a substrate and having an upper surface; a plurality of spaced laterally extending trenches formed into said trench-receiving layer; a diffusion of the other of said conductivity types extending into the walls of said trenches and having a given depth and a given concentration; said trenches defining mesas between them of a given width and a given concentration; a drain region of said other of said conductivity types extending into said trench receiving layer and disposed at one end of said trenches; a MOSgate structure including a source region, base region and a gate electrode disposed at the other end of said trenches; the thickness and concentration of said mesas and said diffusions being selected to cause each to fully deplete under blocking voltage conditions, wherein each of said mesas extends between said drain region and said MOSgate structure.

2. The device of claim 1 which further includes a dielectric filler in each of said trenches.

3. The device of claim 1 which further includes source, drain and gate contacts supported on said upper surface and connected to said source region, gate electrode and drain regions respectively.

4. The device of claim 1 wherein said substrate is a lightly doped P type material and wherein said diffusion and said mesas have RESURF concentrations.

5. The device of claim 1 which includes a further region of said other conductivity interposed between said substrate and said trench-receiving layer; said further region being more lightly doped than said diffusion; said diffusion extending into said further region along the bottoms of said trenches.

6. The device of claim 1 wherein said diffusion extends into said substrate at the bottoms of said trenches.

7. The device of claim 1 which further includes an insulation layer interposed between said substrate and said trench-receiving layer; the upper surface of said insulation layer being coplanar with the bottoms of said trenches.

8. The device of claim 5 which further includes a dielectric filler in each of said trenches.

9. The device of claim 5 which further includes source, drain and gate contacts supported on said upper surface and connected to said source region, gate electrode and drain regions respectively.

10. The device of claim 5 wherein said substrate is a lightly doped P type material and wherein said diffusion and said mesas have RESURF concentrations.

11. The device of claim 8 which further includes source, drain and gate contacts supported on said upper surface and connected to said source region, gate electrode and drain regions respectively.

12. The device of claim 8 wherein said substrate is a lightly doped P type material and wherein said diffusion and said mesas have RESURF concentrations.

13. The device of claim 9 wherein said substrate is a lightly doped P type material and wherein said diffusion and said mesas have RESURF concentrations.

14. The device of claim 11 wherein said substrate is a lightly doped P type material and wherein said diffusion and said mesas have RESURF concentrations.

15. The device of claim 6 which further includes a dielectric filler in each of said trenches.

16. The device of claim 6 which further includes source, drain and gate contacts supported on said upper surface and connected to said source region, gate electrode and drain regions respectively.

17. The device of claim 6 wherein said substrate is a lightly doped P type material and wherein said diffusion and said mesas have RESURF concentrations.

18. The device of claim 15 which further includes source, drain and gate contacts supported on said upper surface and connected to said source region, gate electrode and drain regions respectively.

19. The device of claim 15 wherein said substrate is a lightly doped P type material and wherein said diffusion and said mesas have RESURF concentrations.

20. The device of claim 16 wherein said substrate is a lightly doped P type material and wherein said diffusion and said mesas have RESURF concentrations.

21. The device of claim 18 wherein said substrate is a lightly doped P type material and wherein said diffusion and said mesas have RESURF concentrations.

22. The device of claim 7 which further includes a dielectric filler in each of said trenches.

23. The device of claim 7 which further includes source, drain and gate contacts supported on said upper surface and connected to said source region, gate electrode and drain regions respectively.

24. The device of claim 7 wherein said substrate is a lightly doped P type material and wherein said diffusion and said mesas have RESURF concentrations.

25. The device of claim 22 which further includes source, drain and gate contacts supported on said upper surface and connected to said source region, gate electrode and drain regions respectively.

26. The device of claim 22 wherein said substrate is a lightly doped P type material and wherein said diffusion and said mesas have RESURF concentrations.

27. The device of claim 23 wherein said substrate is a lightly doped P type material and wherein said diffusion and said mesas have RESURF concentrations.

28. The device of claim 25 wherein said substrate is a lightly doped P type material and wherein said diffusion and said mesas have RESURF concentrations.

* * * * *